(12) United States Patent
Worley

(10) Patent No.: US 8,085,571 B2
(45) Date of Patent: Dec. 27, 2011

(54) HIGH DENSITY PROM

(76) Inventor: Eugene Robert Worley, Irvine, CA (US)

(*) Notice: Subject to any disclaimer, the term of this patent is extended or adjusted under 35 U.S.C. 154(b) by 457 days.

(21) Appl. No.: 12/319,573

(22) Filed: Jan. 9, 2009

(65) Prior Publication Data
US 2010/0128511 A1    May 27, 2010

Related U.S. Application Data

(60) Provisional application No. 61/010,377, filed on Jan. 9, 2008.

(51) Int. Cl.
*G11C 17/00* (2006.01)
(52) U.S. Cl. ............ 365/96; 365/105; 365/189.07
(58) Field of Classification Search .............. 365/96, 365/105, 189.07
See application file for complete search history.

(56) References Cited

U.S. PATENT DOCUMENTS

| | | | |
|---|---|---|---|
| 4,146,902 A | | 3/1979 | Tanimoto et al. |
| 4,701,695 A | | 10/1987 | Chan et al. |
| 5,193,073 A | * | 3/1993 | Bhuva ............... 365/226 |
| 6,625,055 B1 | * | 9/2003 | Smith et al. ........... 365/148 |
| 6,850,432 B2 | * | 2/2005 | Lu et al. ............ 365/163 |
| 6,958,523 B2 | | 10/2005 | Babcock et al. |
| 2003/0189851 A1 | * | 10/2003 | Brandenberger et al. ... 365/200 |
| 2004/0037106 A1 | * | 2/2004 | Lu et al. ............. 365/96 |
| 2009/0097295 A1 | * | 4/2009 | Morimoto ............. 365/51 |
| 2010/0110778 A1 | * | 5/2010 | Lee et al. ............ 365/163 |
| 2011/0007554 A1 | * | 1/2011 | Kaeriyama et al. ....... 365/148 |
| 2011/0096588 A1 | * | 4/2011 | Fasoli ............... 365/148 |

OTHER PUBLICATIONS

E. Worley, "Distributed Gate ESD Network Architecture for Inter-Power Domain Signals", Proceedings of the EOS/ESD Symposium, EOS-26, 2004, p. 238.

* cited by examiner

*Primary Examiner* — Tuan T. Nguyen

(57) ABSTRACT

The invention shows how diodes in a modern semiconductor process can be used as a very compact switch element in a Programmable Read Only Memory (PROM) using common integrated circuit fuse elements such as polysilicon and metal. This compact switch element allows very dense PROM arrays to be realized since diodes have the highest conduction density of any semiconductor device. The high conduction density is used to provide the relatively high current needed to blow the fuse element open. Since MOSFETs are typically used as fuse array switch elements, a relatively large area is required for the MOSFET to reach the current needed to blow the fuse element. Since diodes are two terminal switch elements unlike MOSFETs which are three terminal devices, methods are outlined on how to both read and write the arrays using this two terminal switch.

17 Claims, 4 Drawing Sheets

HIGH DENSITY PROM

RELATED APPLICATION

This application claims the benefit of U.S. Provisional Application No. 61/010,377 entitled "High Density Polysilicon Fuse ROM" filed on Jan. 9, 2008, the specification of which is incorporated herein in its entirety by reference.

BACKGROUND OF THE INVENTION

1. Field of the Invention

The present invention is generally in the field of integrated circuits and, specifically, the invention is in the field of fuse based One Time Programmable (OTP) ROMs or PROMs.

2. Prior Art

Fuse based Programmable Read Only Memories (PROMs) were common up until the 80's when they were largely replaced by UV erasable EPROMs. For example, in U.S. Pat. No. 4,701,695 a metal fuse based PROM is shown in which an NPN bipolar transistor is used to select a fuse in an array of fuses. The fuse is blown or opened with about 50 mA of current at a voltage of 3V. The term program refers to changing the electrical resistive state of fuses in a PROM array to be representative of a desired bit pattern.

There is, however, a need to embed some amount of programmable read only memory in standard CMOS circuits. The PROM can be used to encode configuration information, date codes, serial numbers, etc. Ideally, the programmable memory or PROM can be made in a generic CMOS process without adding any additional processing steps for the PROM.

SUMMARY OF THE INSTANT INVENTION

It is the objective of this invention to show compact layout methods for a resistor based fuse or anti-fuse PROM using a P+/N well diode as the select element. It is shown how a type of programmable element, the polysilicon resistor, can have a characteristic that allows it to be electrically altered to either a lower resistance or a higher resistance value over its initial resistance value. It is another objective to show that the use of diodes as the programmable element select device results in a compact layout since the diode has a high conduction density relative to other means such as MOSFETs and can be made in common CMOS processes without additional processing steps. Another objective to use a common N well and common N+ diffusion between two cells along a work line to increase memory cell density. Yet another objective is show a means to read the PROM that avoids the issue of current bleed of the parasitic collector to the substrate and the variability of the substrate resistance of the parasitic bipolar transistor associated with the select diode.

DESCRIPTION OF THE PREFERRED EMBODIMENT

The present invention is directed to a polysilicon based fuse or anti-fuse PROM cell having high density that can be manufactured in a standard CMOS process. A fuse is defined as a resistor wherein applying a sufficient electrical stress substantially increases the resistance value of the resistor relative to the value it had in its initial or virgin state and an anti-fuse is defined as a resistor wherein applying a sufficient electrical stress decreases the resistance value of the resistor relative to the value it had in its initial state. Although metal based fuses can also be used, polysilicon based fuses are more common in modern semiconductor processes since metal fuses require substantially more current to blow or open.

Figure 1:
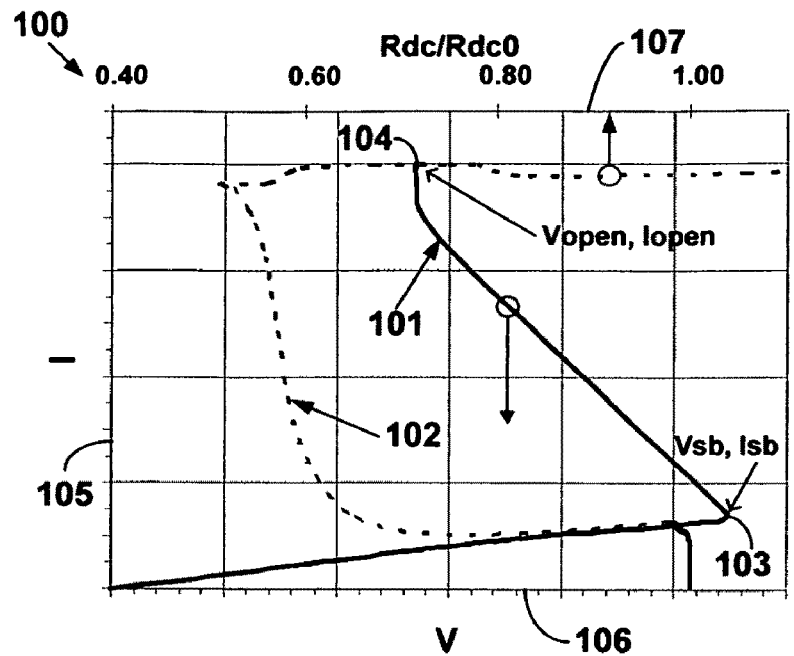
FIG. 1 shows a pulsed I-V diagram of a polysilicon resistor.

FIG. 1 shows the pulsed I-V characteristic of a poly silicon resistor (from FIG. 12 of E. Worley, "Distributed Gate ESD Network Architecture for Inter-Power Domain Signals", Proc. EOS/ESD Symposium, EOS-26, 2004). 105 is the current axis, 106 is the voltage axis, and 107 is the Rdc/Rdc0 axis where Rdc/Rdc0 is the ratio of the low current DC resistance of the resistor after each stress pulse to the initial, unstressed low current DC resistance. The pulsed I-V curve 101 is observed to be essentially linear up to a point 103 where a "snap-back" in the curve is observed. Up to this point 103 the Rcd/Rdc0 curve 102 shows a ratio of 1 thus indicating no change in the physical state of the value of the resistor. The snap-back is caused by the thermal generation of carriers that exceeds the carrier density produced by the ionized impurity concentration. In the snap-back region the reference shows that the poly silicon enters into the liquid state. Also, in the snap-back region the low current DC resistance decreases relative to the initial resistance as seen in the decrease of Rdc/Rdc0 curve 102 upon snap-back. Thus, at this stress level the resistor is acting like an anti-fuse. As the pulsed current is increased well beyond the snap-back point 103 the voltage will eventually stop collapsing at a high rate with current. At a high enough current 104 the poly silicon resistor will open with the Rcd/Rdc0 ratio becoming much greater than 1. Thus, at very high levels of stress, the polysilicon resistor acts like a fuse. The cause of the reduction in resistance immediately after snap-back is not known but is most likely due to the electrical activation of the dopant species in the polysilicon resistor that is not activated. That is, after implant anneal only part of the implanted species is electrically active while some of the implant is not. During snap-back the part of the implant that is not electrically active becomes active because of the annealing action of the very high temperature reached by the silicon during the pulsed current stress. The fact that the resistance decreases after a pulsed current stress means that the poly silicon resistor can be used as an anti-fuse. At higher pulsed currents the poly silicon resistor opens and, therefore, acts like a fuse. Thus, as the pulsed current is increased, the fuse transitions from it's normal state to a low resistance state and finally to a high resistance state. The advantage of the anti-fuse or low resistance state is that less energy is required to change the poly silicon resistor into the anti-fuse state than it does to change the resistor into the fuse state.

A resistor that can be altered by an electrical stress to a substantially higher resistance state (fuse) or a resistor that can be altered by electrical stress to a substantially lower resistance state (anti-fuse) will be referred to as a programmable element. Specifically, a fuse type of programmable element can have its conductance decreased by 10% or less and an anti-fuse type of programmable element can have its conductance increased by 40% or more.

Figure 2:
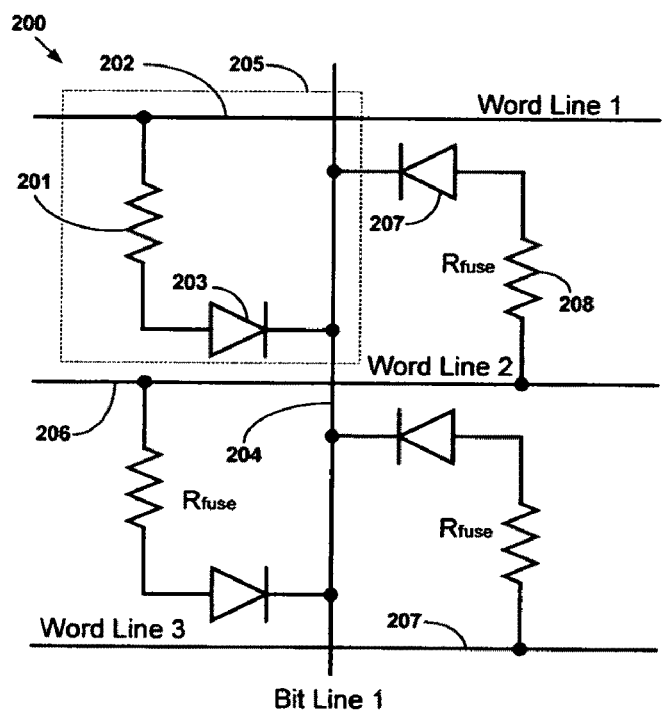
FIG. 2 shows a circuit schematic diagram of a programmable element array with P+/N well diodes use as select devices.

FIG. 2 show the schematic diagram of a PROM fuse or anti-fuse array 200 of the preferred embodiment. A PROM cell 205 comprises a programmable element 201 and a series select diode 203. The cathode of the select diode is N+ diffusion or implant in an N well and the anode is P+ diffusion or implant in an N well that is common to the N well of the N+ implant. To make the layout more compact, the N+ diffusion is common to two cells that are horizontally adjacent to each other as in the case of diode 203 and 207 which, in the layout, share a common N+ diffusion connected to Bit Line 1, 204.

To program the programmable element 201 Word Line 1, 202, is raised to a positive voltage and Bit Line 1 is held at or near ground potential or Vss. This bias configuration forward biases select diode 201 and causes a current to flow through programmable element 201. Given enough current and time and type of programmable element, programmable element 201 will either have enhanced conductivity or reduced conductivity. For a polysilicon resistor used as the programmable element the magnitude of the of the current pulse and its duration will determine whether it acts as a fuse element or an anti-fuse element. One method of programming is to apply a series of pulses to the programmable element with intermediate reading of the resistance of the programmable element until a desired resistance is achieved. Deselected word lines such as Word Line 2 and Word Line 3 are held at ground potential or Vss and deselected bit lines at a high positive voltage level. This either back biases deselected diodes or places a 0V bias across the deselected diodes such as 207 so that no current flows in deselected diodes.

Figure 3:
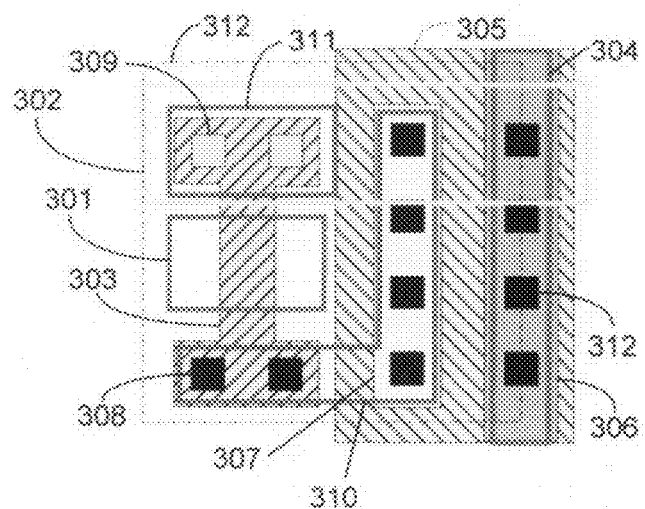
FIG. 3 shows the layout of a PROM cell of the preferred embodiment.

FIG. 3 shows a layout of the poly silicon resistor PROM cell 312 including the poly silicon resistor 303 and the select diode comprising a P+ diffusion or implant 307, an N well 305, and an N+ diffusion or implant 306. Note that a polysilicon resistor 303 is used as an example of the more general programmable element. The P+ diffusion 307 forms the P region of the select diode and the N well 305 forms the N region of the diode with the N+ diffusion 306 serving as the electrically connective medium between the N well, which is relatively lightly doped, and the metal bit line 304. The poly silicon resistor is assumed in this example to be salicided. Thus, a salicide block mask 301 is applied to the body of the resistor so that no salicide is present over most of the poly silicon resistor length. Salicide poly resistors generally have too low a resistivity to make useful fuses. However, in more advanced processes where the resistivity is higher (>a few Ohms per square), salicided poly resistors may be useful as fuses. Note that salicide is required to make contact between metal and poly silicon. Thus, salicide is retained at the ends of the poly silicon resistor where the contacts are located. Poly silicon contacts such as 308 are used to connect the ends of the poly silicon resistor to metal interconnect. Metal interconnect line 310 is used to connect one end of the poly silicon resistor 303 to the P+ diffusion 307. Metal line 304 is the bit line of the PROM cell and connects to the N+ diffusion 306 using contacts such as 312. The second end of the poly silicon resistor 303 connects to a level 1 metal line 311, which, in turn, connects to a level 2 metal line 302. The level 2 metal line 302 forms the Word Line of the PROM cell 312. A level 2 metal line is used since the Word Line metal 302 must pass over level 1 metal lines 310 and 304 without connecting to them. The square symbol 309 represents both contact for connecting silicon diffusion to metal level 1 and via for connecting metal level 1 to metal level 2. Note that the right hand cell 312 boundary passes though the center of the N+ diffusion 306 contacts such as 312. Thus, the N+ diffusion 306 is shared with the adjacent cell to the right of cell 312. The sharing of the N+ diffusion 306 between cells is done to make the cell more compact.

Although 2 contacts at each end of the poly silicon resistor are shown, 1 or more than 2 contacts could have been used, depending on the current requirements to change the state of the resistor.

Figure 4:
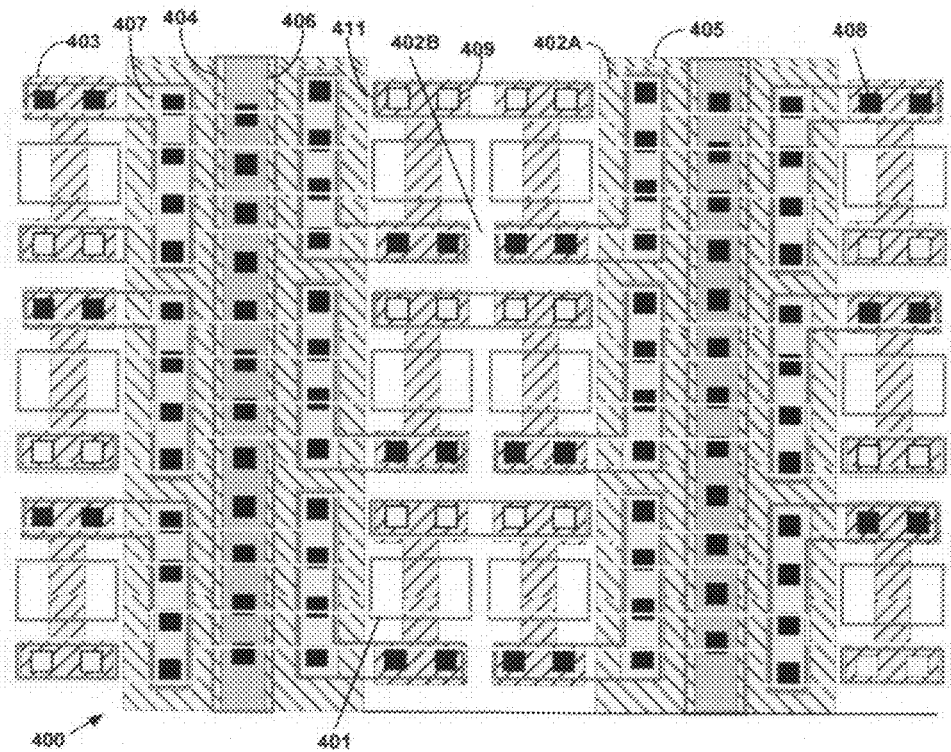
FIG. 4 shows the layout of an array of polysilicon PROM cells of the preferred embodiment.

FIG. 4 shows how the cells are arrayed. In this layout illustration 400 twelve arrayed cells are shown. 403 is one of the twelve poly silicon resistors used as the programmable element, 407 is one of 12 P+ diffusions which form an anode of a select diode, rectangle 409 is an example of a stacked contact and via combination, 408 is an example of a contact, 404 is the metal bit line for the left hand side of the array, 401 is an example of a salicide block mask, and 404 is one of 2 bit lines shown in FIG. 4. Note that the N+ diffusion 406 is a continuous rectangle running the length of the bit line as well as the N well implant 405. The N well 405 is made continuous along the length of the bit line 404 since N well to N well separations are large and would lower the cell layout density. Furthermore, forming a continuous N well 405 along the length of the bit line 404 does not affect the operation of the select diode. Note that there are two word lines crossing over each cell, such as 402A and 402B, which are needed since the two adjacent cells with a common N+ diffusion such as 406 must be connected to different word lines.

As can be appreciated by one normally skilled in the art, the polarities of the diffusions or implants of the lateral diodes shown in FIGS. 3 and 4 can be inverted for diodes in deep N well or for diodes in N types substrates. For two adjacent diodes in Deep Nwell or in N type substrate the P+ diffusion or implant is shared on the common bit line. For example, in FIG. 3 the Nwell 305 would become a Pwell and the N+ diffusion or implant would become a P+ diffusion or implant. For processes with a Deep Nwell the aforementioned reverse polarity implant areas would be encased in Deep Nwell. Programming and read currents would be reversed as well.

Figure 5:
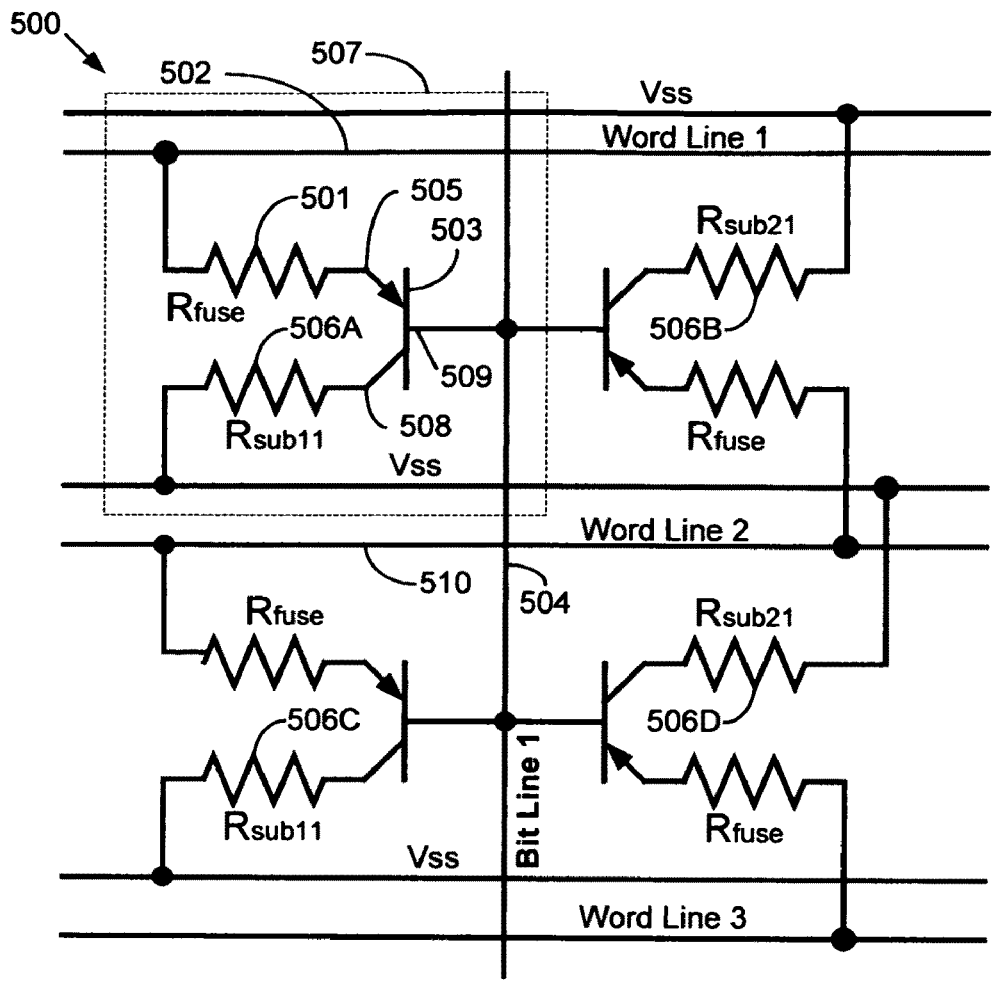
FIG. 5 illustrates the parasitic bipolar PNP and the variable collector resistance associated with the select diode of FIG. 2.

FIG. 5 shows a circuit diagram of the PROM array 500 with the parasitic elements included, unlike that of FIG. 2. For the PNP bipolar transistor 503 the substrate under the N well 305 of FIG. 3 acts like a collector 508 with the P+ diffusion 307 being the emitter 505 and the N well 305 being the base 509. Thus, the emitter 505-base 509 junction corresponds to the anode and cathode of diode 203 of FIG. 2, respectively. The collector series resistance represented by Rsub 506 varies in value depending on the location of the substrate tie. For example, if a P+ substrate tie ring, which is connected to Vss 510, is located at the periphery of an array or sub-array, then the collector resistance of a given cell can vary substantially as a function of cell position relative to the tie ring. Thus, the various Rsub resistors shown in the exemplary 4 array cells of FIG. 5, 506A, 506B, 506C, and 506D, can be of different values. The amount of current that can therefore flow into the collector and through the substrate to the substrate P+ tie diffusion is a function of the parasitic bipolar current gain, β, and the collector debiasing due to the IR drop of the collector's substrate resistance. The current gain or β for the parasitic bipolar ranges from about 1 to 3 for CMOS processes 0.18 μm and lower. For cell 507 in the programming mode the current is high enough such that the substrate resistance will de-bias the collector voltage to the point where most of the current will flow out the base 509 and into the Bit Line 1 504 assuming that Word Line 1 502 is in the high state and Bit Line 1 504 is in the low state. The fact that some current will flow into the substrate to Vss 510 is of no consequence since all of the programming current from Word Line 1 502 flows through the poly silicon fuse 501 and into the emitter 505 of 503. Thus, the current flowing out of PNP 509 in the programming mode will then consists of two components, the base current flowing into the Bit Line 1, and the current flowing out of the collector or N well/P substrate junction and into Vss 510 due to the substrate link.

Although there is no issue with any current flowing into the substrate due to parasitic bipolar action during programming it is an issue with reading the PROM cell 507. This is because during the read mode less current is used than during the programming mode since the resistance of the programmable element must remain essentially constant during all subsequent reading throughout the life of the part containing the PROM. Typically, this means that the read current must be on the order of a factor of 10 lower than the programming current. Thus, less current flowing through the select device 503 means less debiasing of the collector voltage due to substrate tie resistance. This means that a higher percentage of emitter 505 current will flow through the collector 508 and a lower percentage through Bit Line 1 504. Furthermore, the current flowing into Bit Line 1 504 can with vary with cell position because of the variability of the substrate resistance between the collector 508 and the P+ substrate tie to Vss. Thus, reading the current from the Bit Line such as 504 is not desirable because of current loss to the collector and the variability of that current loss with cell position.

Figure 6:
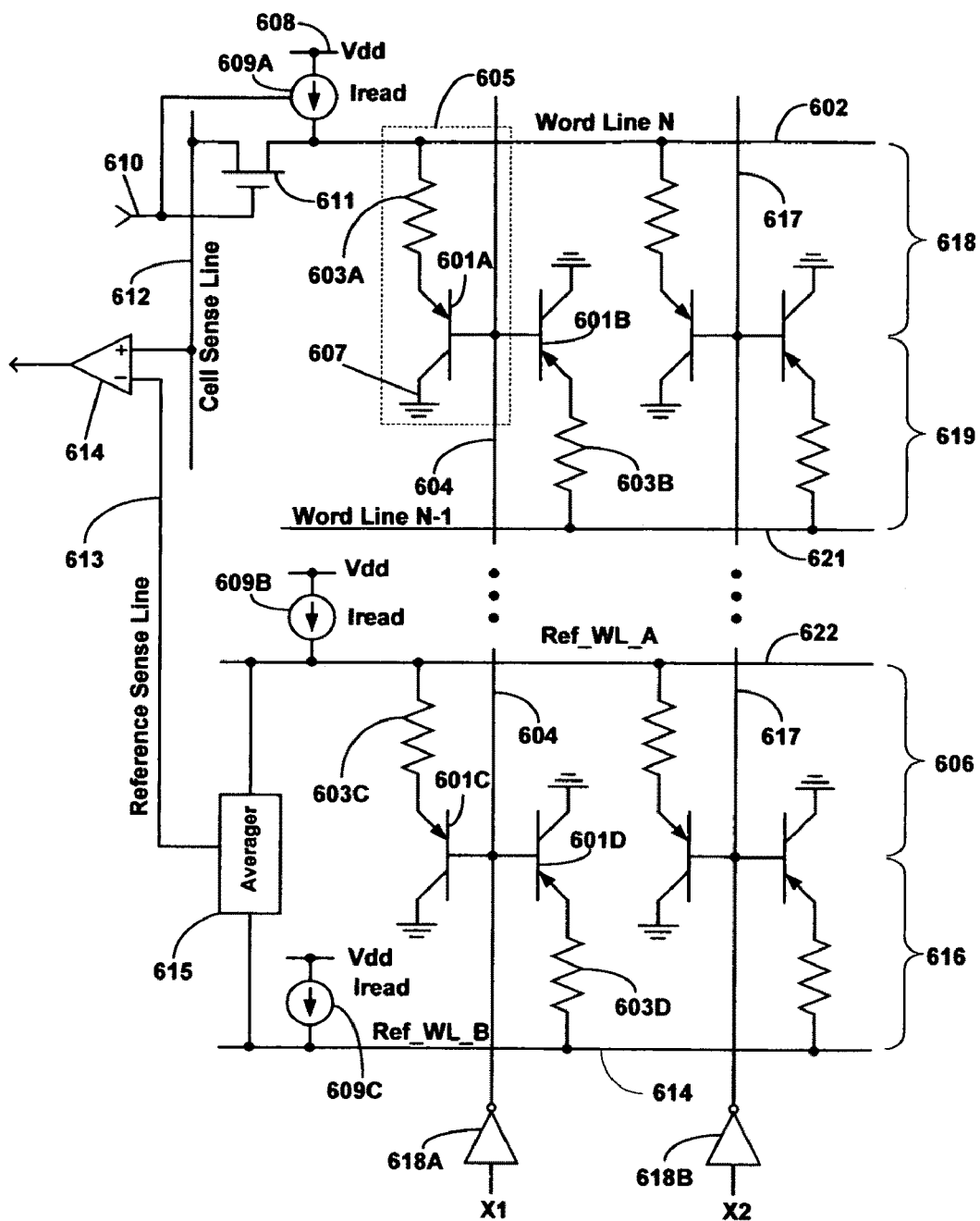
FIG. 6 shows the read circuit configuration that avoids the effects of the variability in the collector or substrate resistance of the parasitic bipolar PNP.

FIG. 6 shows a diagram of a read circuit that overcomes the issues with collector current loss to substrate and the variability of the current loss with cell position. The exemplary read circuit comprises PROM memory cell 605, a word line 602 used to select a row of cells, a row of cells 618 connected to word line 602, a row of cells 619 connected to word line 621, a row of reference cells 606 connected to word line 622, a second row of reference cells 616 connected to word line 614, a read current source 609A connected to word line 602, a read current source 609B connected to word line 622, a read current source 609C connected to word line 614, an averaging circuit 615 whose inputs are connected to word lines 622 and 614 and whose output is connected to 613, sense differential comparator 614 whose positive input is connected to 613 and whose negative input is connected to 612, bit line driver 618A connected to bit line 604, bit line driver 618B connected to bit line 617, and select switch 611 connected to word line 602 and to sense line 612. An input 610 is used to turn the sense line select switch 611 "on" and "off" and to turn the read current source 609A "on" and "off".

To read the cell 605 bit line driver 618A drives bit line 604 to ground or Vss and bit line driver 618B drives bit line 617 high or to Vdd. Note that bit line 604 is in the selected state for read and bit line 617 is in the deselected state. To select word line 602 the read current source 609 is turned on and the read select switch 611 is also turned on connecting word line 602 to the sense line 612. Word line 621, which is in the deselected state, is held at Vss. Thus, current flows from word line 602 into the programmable element 603A of cell 605. From the programmable element 603A the read current enters the emitter of the select device 601A, which is a parasitic bipolar transistor. Some of the read current emerges out the base of 601A and into word line 604 and the remainder out through the collector 607 and to Vss through the substrate resistance, which is not shown. Thus, the voltage appearing on word line 602 is equal to the sum of the base-emitter junction voltage drop of 601A and the IR drop of the programmable element 603A. The voltage on word line 602 is transferred with essentially no attenuation to sense line 612.

During a read operation the read current source 609 and 617 are also turned on. These current sources are connected to the word lines of the read reference cells. One row of the read reference cells, 606 in this example, have been placed in the programmed or altered state while the second row of read cells, 616, have not been programmed and are therefore in the virgin or un altered state. The voltage appearing on word line 622 is the sum of the voltage drop of the base-emitter junction of 601C and the IR drop of the poly programmable element 603C. The voltage of word line 614 is the sum of the voltage drop of the base-emitter junction 601D and the IR voltage drop of programmable element 603D. The voltage appearing on the reference sense line 613 is the average of the voltage on word line 622 and the voltage appearing on work line 614. Stated mathematically, $$V_{reference} = \frac{I_{read}(R_{fuseC} + R_{fuseD}) + V_{BE\_C} + V_{BE\_D}}{2}$$

where $V_{reference}$ is the voltage appearing on the reference sense line 613, $I_{read}$ is the value of the read current sources 609B and 609C, $R_{fuseC}$ is the programmable element 603C which is in the altered state, $R_{fuseD}$ is the programmable element 603D which is in the un-altered state, $V_{BE\_C}$ is the base-emitter drop of parasitic bipolar transistor 601C, and $V_{BE\_D}$ is the base-emitter drop of parasitic bipolar transistor 601D.

The voltage appearing on the sense line 612 is given by $$V_{sense\_line} = I_{read} R_{fuseA} + V_{BE\_A}$$

where $V_{sense\_line}$ is the voltage appearing on the sense line 612, $I_{read}$ is the value of the read current source 609A, $R_{fuseA}$ is the programmable element 603A, which can be in either the altered state or un-altered state, and $V_{BE\_A}$ is the base-emitter drop of parasitic bipolar transistor 601A.

An analysis of bipolar transistor model equations show that the base-emitter voltage drop is a weak function of collector current for a given emitter current. Thus, the percentage of emitter current flowing out through the collector will influence the base-emitter or $V_{BE}$ drop by, at most, a couple of 10's of milli-volts. The $V_{BE}$ drop is therefore relatively insensitive to collector resistance, which largely removes the cell's read sensitivity to cell position relative to the substrate tie. Thus, the voltage difference appearing at the inputs of the differential sense amplifier is given by $$V_{difference} = I_{read}\left(R_{fuseA} - \frac{1}{2}(R_{fuseC} + R_{fuseD})\right) + \Delta V_{BE}$$

where $V_{reference}$ is the difference voltage presented to the inputs of sense amplifier 614, $I_{read}$ is the value of the read current sources 609A, 609B, and 609C, which are equal to each other, $R_{fuseA}$ is the resistance value of programmable element 603A, $R_{fuseA}$ is the resistance value of programmable element 603A, $R_{fuseC}$ is the resistance value of the programmable element 603C, $R_{fuseD}$ is the resistance value of programmable element 603D, and $\Delta V_{BE}$ is the error voltage associated with variations in the base-emitter voltage drops associated with transistors 601A, 601C, and 601C and has a value on the order of a couple of 10's of milli-volts at most. Let a equal the ratio of the altered state resistance of the of the programmable element to the un-altered resistance and $R_{virgin}$ equal the un-altered resistance then $$V_{difference} = I_{read}\left(R_{fuseA} - \frac{1}{2}R_{virgin}(1+\alpha)\right) + \Delta V_{BE}$$

Thus, the differential voltage is given by $$V_{difference} = \pm \frac{I_{read}R_{virgin}}{2}(1-\alpha) + \Delta V_{BE}$$

The sign in the above equation is positive if the value of the programmable element 603A is un-altered and negative if altered due to programming stress. The value of $\frac{1}{2}I_{read}R_{virgin}(1-\alpha)$ must be greater than $\Delta V_{BE}$ by a few of 10's of millivolts to provide reliable reading of the PROM cells. If the programming voltage for the programmable element is 2V then a read voltage of 0.2V should not alter the programmable elements over the life of the PROM and will provide more than enough read margin. Note that $\alpha$ can either be less than 1, which corresponds to anti-fuse programming or greater than 1, which corresponds to fuse programming.

The differential comparator 614 reads the polarity of the difference of the input signals and outputs either a logic 1 or a logic 0 corresponding to the state of the programmable element 603A in this example.

As anyone normally skilled in the art, for array diodes of reverse polarity than that shown is FIGS. 3 and 4, the read currents must be reversed and the bit line voltages of selected bit line, the unselected bit lines, and the unselected word lines inverted.

The invention claimed is:

1. A programmable array, comprising:
   a first cell comprising:
      a first programmable element; and
      a first select diode in series with first programmable element; and
   a second cell comprising:
      a second programmable element; and
      a second select diode in series with second programmable element;
   wherein the first and second select diodes are coupled to a common bit line.

2. The programmable array of claim 1, wherein each of the first and second select diodes comprises a P+/N well diode.

3. The programmable array of claim 2, wherein the first and second select diodes have a common N well.

4. The programmable array of claim 3, further comprising a N+ region in the N well, wherein the N+ region couples both the first and second select diodes to the common bit line.

5. The programmable array of claim 1, wherein each of the first and second programmable elements comprises a polysilicon resistor.

6. The programmable array of claim 1, wherein each of the first and second programmable elements comprises metal.

7. The programmable array of claim 1, wherein each of the first and second select diodes comprises a N+/P well diode.

8. The programmable array of claim 7, wherein the first and second select diodes have a common P well.

9. The programmable array of claim 8, further comprising a P+ region in the P well, wherein the P+ region couples both the first and second select diodes to the common bit line.

10. A method for programming a programmable memory cell, the programmable memory cell comprising a polysilicon resistor, the method comprising:
    driving a current through the polysilicon resistor until conductivity of the polysilicon resistor increases from an initial state to a programmed state, the programmed state having 40% or greater conductivity than the initial state.

11. A method for reading a memory cell in a memory array, the memory array reference memory cells comprising a first reference memory cell and a second reference memory cell, the method comprising:
    averaging read voltages across the first and second reference memory cells to produce a reference voltage;
    comparing a read voltage across the memory cell to the reference voltage; and
    determining a bit value of the memory cell based on the comparison.

12. The method of claim 11, wherein the first reference memory cell is in a programmed state and the second reference memory cell is in an initial state.

13. The method of claim 12, wherein the first reference memory cell comprises a polysilicon resistor in the programmed state and the second reference memory cell comprises a polysilicon resistor in the initial state.

14. The method of claim 13, wherein the polysilicon resistor in the programmed state has 40% or greater conductivity than the polysilicon resistor in the initial state.

15. The method of claim 13, wherein polysilicon resistor in the programmed state has 10% or less conductivity than the polysilicon resistor in the initial state.

16. The method of claim 11, wherein the memory cell and the first and second reference memory cells all share a common bit line in the memory array.

17. The method of claim 11, further comprising driving a read current into the memory cell to produce the read voltage across the memory cell.

\* \* \* \* \*